(12) United States Patent
Choi

(10) Patent No.: US 7,225,303 B2
(45) Date of Patent: May 29, 2007

(54) METHOD AND APPARATUS FOR ACCESSING A DYNAMIC MEMORY DEVICE BY PROVIDING AT LEAST ONE OF BURST AND LATENCY INFORMATION OVER AT LEAST ONE OF REDUNDANT ROW AND COLUMN ADDRESS LINES

(75) Inventor: Joo S. Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 329 days.

(21) Appl. No.: 10/668,009

(22) Filed: Sep. 22, 2003

(65) Prior Publication Data

US 2005/0066141 A1 Mar. 24, 2005

(51) Int. Cl.
*G06F 13/00* (2006.01)

(52) U.S. Cl. .................. 711/154; 711/105; 711/168; 711/170; 365/189.01

(58) Field of Classification Search ............. 711/168, 711/170, 104, 105, 154; 365/230.01, 233, 365/189.01
See application file for complete search history.

(56) References Cited

U.S. PATENT DOCUMENTS

| | | | | |
|---|---|---|---|---|
| 5,568,445 A | * | 10/1996 | Park et al. ............... | 365/233 |
| 6,134,638 A | * | 10/2000 | Olarig et al. ............. | 711/167 |
| 6,418,068 B1 | * | 7/2002 | Raynham ................. | 365/200 |
| 6,542,416 B1 | * | 4/2003 | Hampel et al. ........... | 365/194 |
| 6,601,156 B2 | * | 7/2003 | Blodgett .................. | 711/213 |
| 6,615,308 B1 | * | 9/2003 | Fanning ................... | 711/105 |
| 6,675,270 B2 | * | 1/2004 | Arimilli et al. ........... | 711/155 |
| 6,687,184 B2 | * | 2/2004 | Johnson et al. .......... | 365/233 |
| 2003/0070051 A1 | * | 4/2003 | Soerensen et al. ....... | 711/167 |
| 2003/0110368 A1 | * | 6/2003 | Kartoz .................... | 713/1 |

\* cited by examiner

*Primary Examiner*—Hong Kim
(74) *Attorney, Agent, or Firm*—Williams, Morgan & Amerson, P.C.

(57) ABSTRACT

A method and apparatus are provided for accessing a dynamic memory device. The method comprises receiving a command from a controller to access a memory, receiving, from the controller, at least one of burst length information and latency information in association with the command to access the memory; and providing data to or from the memory in response to the command based on at least one of the burst length information and the latency information.

19 Claims, 10 Drawing Sheets

METHOD AND APPARATUS FOR ACCESSING A DYNAMIC MEMORY DEVICE BY PROVIDING AT LEAST ONE OF BURST AND LATENCY INFORMATION OVER AT LEAST ONE OF REDUNDANT ROW AND COLUMN ADDRESS LINES

BACKGROUND OF THE INVENTION

1. Field of the Invention

This invention relates generally to dynamic memory devices, and, more specifically, to a dynamic memory device adapted to be accessed with an adjustable burst length, column address strobe (CAS) latency, and/or write latency.

2. Description of the Related Art

Generally, there are at least two types of data transfers to and from memory. A first type includes a data transfer for a main client that requires large amounts of data to be transferred to and from the memory. A second type of data transfer is for a peripheral client that typically requires small amounts of data to be transferred to and from the memory.

To allow greater flexibility for data transfers, many of today's dynamic memory devices, such as Synchronous RAM (SDRAM), double data rate SDRAM (DDR SDRAM), Rambus™ DRAM (RDRAM) and the like, are usually designed to operate at various latency levels and burst lengths. For example, a semiconductor memory device may perform a latency and burst operation with latency 1, 2, and 3, and variable operation modes of burst length 1, 2, 4 and 8. The latency level and the burst length for a given mode of operation of the semiconductor memory device are commonly defined by a programmable mode register.

CAS latency is the delay that may be measured in clock cycles, between the presentation of a READ command and the availability of the first bit of the output data. For example, if latency is set at 3, data is output from the memory 3 clock cycles after a read command or signal is applied to the memory.

The term "burst length" refers to a number of column locations that can be accessed from the memory in which the read and write accesses to memory are burst oriented. In a burst operation, a column address is provided after a row address, and data from continuous column addresses thereafter is output at high speed in synchronization with a clock signal. For example, if burst length is set at eight (8), a semiconductor memory device outputs, for example, eight (8) bits of data in synchronization with the clock signal based on a starting column address. Typically, if a starting column address is provided from an external source, the next seven (7) column addresses are generated internally by a column address generation circuit.

While a semiconductor memory device may be capable of supporting multiple modes of operation (i.e., different latency levels and/or burst lengths), as a general matter, the operation mode of the memory device cannot be altered without reprogramming its mode register. Changing the operation mode of the memory device, however, may be a time consuming process, as the reprogramming must be loaded (or reloaded) when all memory banks are idle and no bursts are in progress. Furthermore, the memory controller must wait a specified amount of time before initiating a subsequent operation after the mode register has been programmed or reprogrammed to a desired state. Additionally, in conventional memory devices, the operation mode of the memory device cannot be altered substantially concurrently with an access command (e.g., read command and write command). This may result in power wastage, as multiple commands may be needed to change the operation mode of the memory device and to access the contents of the memory device.

The present invention is directed to overcoming, or at least reducing, the effects of, one or more of the problems set forth above.

SUMMARY OF THE INVENTION

In one aspect of the present invention, a method for accessing a dynamic memory device is provided. The method comprises receiving a command from a controller to access a memory, receiving, from the controller, at least one of burst length information and latency information in association with the command to access the memory; and providing data to or from the memory in response to the command based on at least one of the burst length information and the latency information.

In another aspect of the present invention, an apparatus is provided for accessing a dynamic memory device. The apparatus comprises a controller that is adapted to provide a command to access a memory array, provide at least one of burst length information and latency information in association with the command to access the memory array, and receive data from the memory array in response to the command based on at least one of the burst length information and the latency information.

In another aspect of the present invention, a system is provided for accessing a dynamic memory device. The system comprises a memory array communicatively coupled to a controller. The controller is adapted to provide a command to access the memory array and to provide at least one of burst length information and latency information in association with the command to access the memory array. The memory array is adapted to provide or receive data in response to the command based on at least one of the burst length information and the latency information.

In another aspect of the present invention, an apparatus is provided for accessing a dynamic memory device. The apparatus comprises a memory that is adapted to receive a command from a memory controller to access contents of the memory, receive, from the memory controller, at least one of burst length information and latency information in association with the command to access the contents, and provide data from the memory in response to the command based on at least one of the burst length information and the latency information.

BRIEF DESCRIPTION OF THE DRAWINGS

The invention may be understood by reference to the following description taken in conjunction with the accompanying drawings, in which like reference numerals identify like elements, and in which:

FIGS. 2, 2A and 2B illustrate a block diagram of a memory array module of the memory of FIG. 1 for supporting memory access at various burst lengths, in accordance with one embodiment of the present invention;

FIGS. 4, 4A and 4B illustrate a block diagram of a memory array module of the memory of FIG. 1 for supporting memory access with various CAS latency levels, in accordance with one embodiment of the present invention;

FIGS. 6, 6A and 6B illustrate a block diagram of a memory array module of the memory of FIG. 1 for supporting memory access with various write latency levels, in accordance with one embodiment of the present invention.

Figure 1:
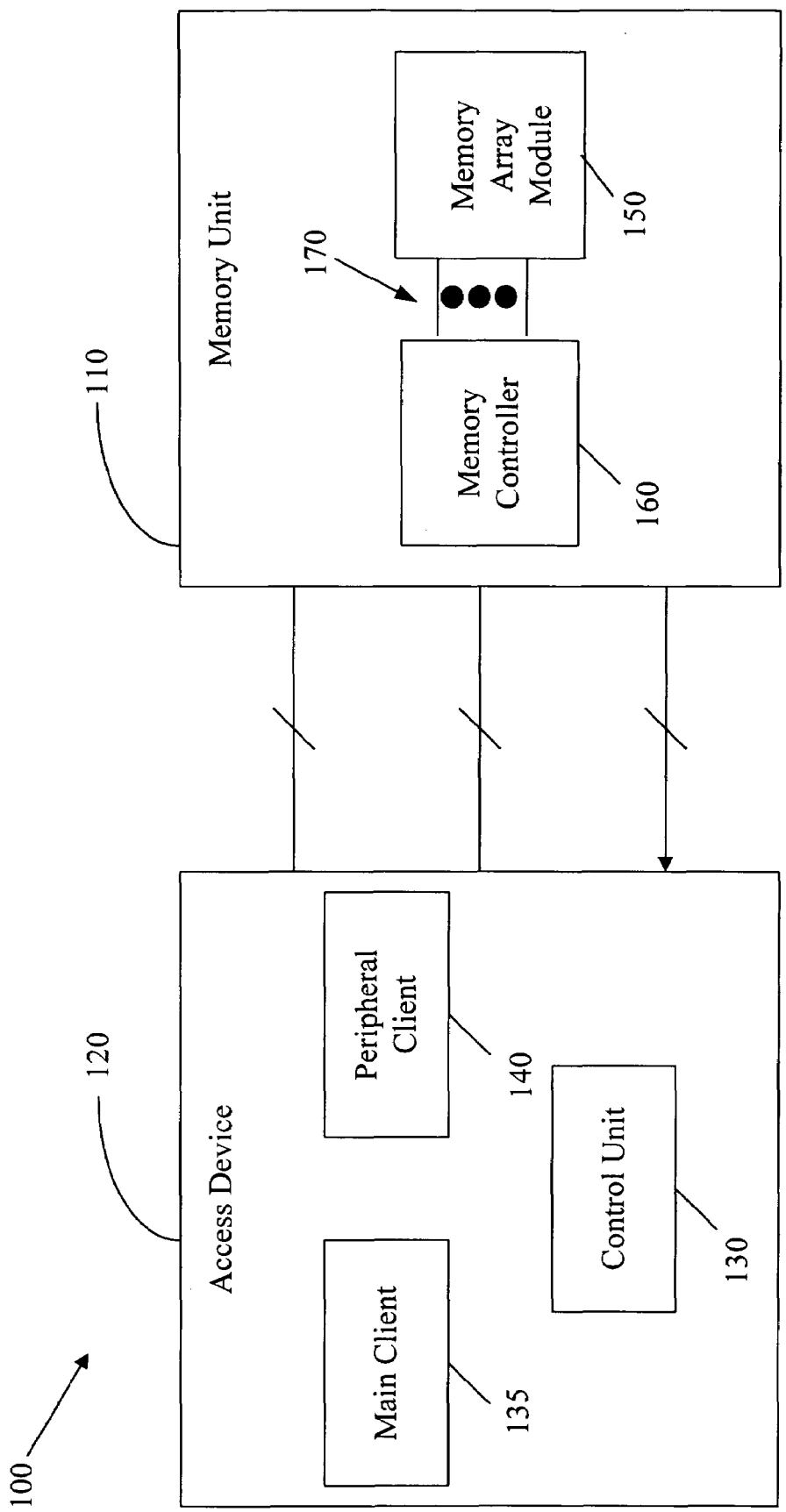
FIG. 1 illustrates a block diagram of a system including a device that is capable of accessing a memory, in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a block diagram of a system 100 is illustrated, in accordance with one embodiment of the present invention. The system 100 comprises a memory unit 110 capable of storing and retrieving data, which may be accessed by a device 120. The access device 120 comprises a control unit 130 capable of accessing data stored in the memory unit 110. The access device 120 may be any device that uses the memory unit 110 to store data, read data, or both. Examples of the access device 120 may include, but are not limited to, a computer unit such as a desktop or portable computer, a camera, a telephone, a cellular phone, a television, a radio, a calculator, a personal digital assistant (PDA), a network switch, a set-top box, and the like.

The control unit 130, in one embodiment, may manage operations of the access device 120 with respect to writing and reading data to and from the memory unit 110. The control unit 130 may comprise a microprocessor, a microcontroller, a digital signal processor, a processor card (including one or more microprocessors or controllers), a memory controller, or other control or computing devices.

In one embodiment, the access device 120 includes one or more main client(s) 135 and one or more peripheral client(s) 140. The main client 135 and peripheral client 140 may be implemented in software, hardware, or a combination thereof. Generally, the main client 135 may be any module that requests larger amounts of data relative to that requested by the peripheral client 140. In the context of a graphics-intensive software application (e.g., video game), the main client 135 may be a subroutine that updates the screen frequently, and thus requires large amounts of data from the memory unit 110. A peripheral client 140 may be a subroutine of the software application that handles tasks that does not require large amount of data from the memory unit 110, tasks such as updating the background of a video game, where the background may remain static for relatively long periods.

The memory unit 110 in the illustrated embodiment may be a volatile memory, such as DRAM, DDR SDRAM, Rambus™ DRAM (RDRAM) and the like. For ease of illustration, the memory unit 110 is described in the context of DDR SDRAM. In one embodiment, the access device 120, via the control unit 130, provides appropriate power and control signals to access memory locations in the memory unit 110. The memory unit 110 may be external to, or internal (e.g., integrated) to, the access device 120. The access device 120, such as a computer system, may employ a memory unit 110 that is integrated within the computer system to store data (e.g., application programs, data, and the like) related to the computer system.

The memory unit 110 may comprise a memory array module 150 and a memory controller 160. Those skilled in the art will appreciate that the memory controller 160 and the memory array module 150 may be located in close proximity to one another on a common substrate, such as a printed circuit board or semiconductor substrate. Alternatively, the memory controller 160 and the memory array module 150 may be located on separate semiconductor substrates or separate printed circuit boards, separated by a relatively significant distance.

The memory array module 150 may comprise a plurality of memory cells for storing data. The memory controller 160 is capable of receiving and executing memory access functions in response to instructions from the control unit 130. In one embodiment, the memory array module 150 may be electrically coupled to the memory controller 160 via a plurality of lines 170, which may include address lines, data lines, and control lines. Access to the memory array module 150 may be directed to the one or more of the memory cells in response to address signals received over the address and control lines 170. Once accessed, data may be written to or read from the memory array module 150 over the data lines 170.

In one embodiment, read and write accesses to the memory array module 150 are burst oriented (i.e., the accesses start at a selected location and continue for a selected number of locations in a programmed sequence). As is described in greater detail below, in accordance with one or more embodiments of the present invention, the memory controller 160 is adapted to access the memory array module 150 at the desired burst length, the read (CAS) latency level, and/or write latency level. For example, depending on the amount of data requested by the access device 120, the memory controller 160 selects the burst length and/or latency accordingly to accessing the desired data from the memory array module 150. In particular, if large amounts of data are desired by, for example, the main client 135 of the access device 120, the memory controller 160 may increase the burst length (and/or decrease the CAS latency level) associated with that memory access. Similarly, the burst length may be reduced (or the CAS latency level may be increased) for smaller data transfers, such as those requested by the peripheral client 140 of the access device 120.

Figure 2A:
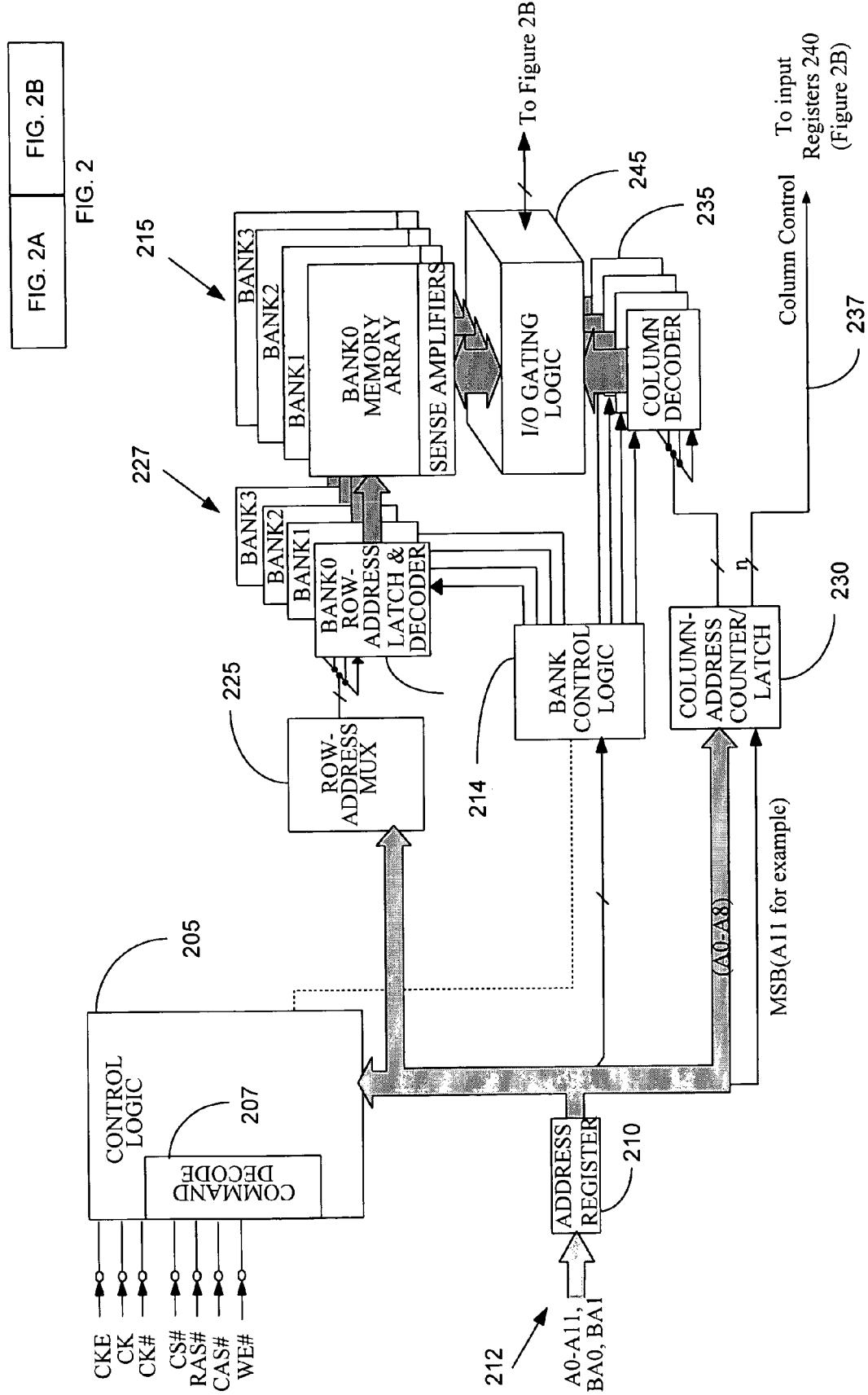
Figure 2B:
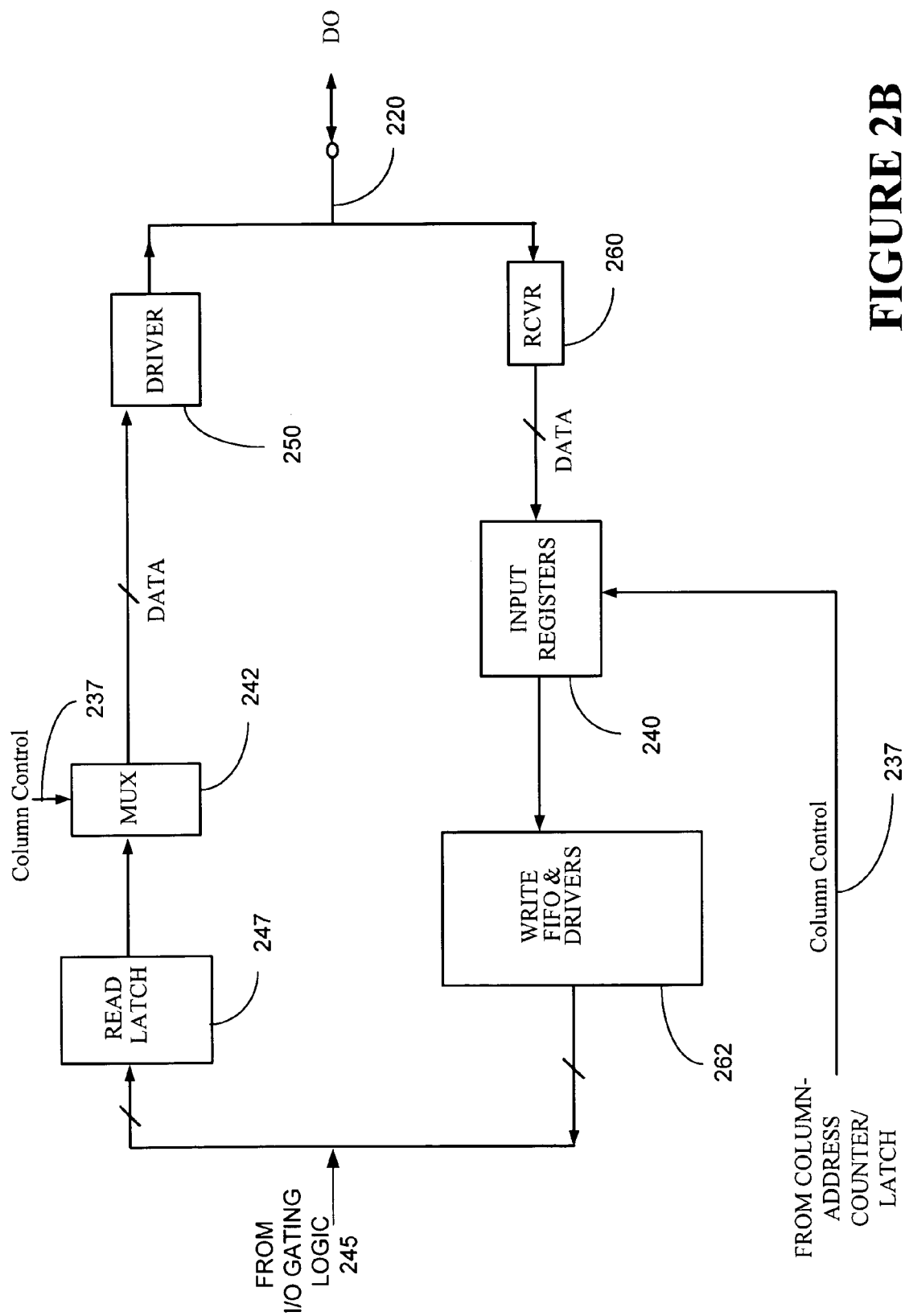

Referring now to FIG. 2, a block diagram of one embodiment of the memory array module 150 of FIG. 1 is illustrated for providing variable burst length accesses. In the illustrated embodiment, the memory array module 150 includes a control logic 205 for controlling the overall data flow to and from the memory array module 150. As shown, the control logic 205 includes a command decode circuitry 207 that is adapted to receive a variety of input signals and, based on one or more of the input signals, decode a command to be executed by the memory array module 150.

The input signals received by the command decode circuitry 207 include a clock enable (CKE) signal, clock input (CK) signal, complementary signal (CK#) to the clock input signal, chip select (CS#) signal, row address strobe (RAS) signal, column address strobe (CAS) signal, and write enable (WE#) signal. In the illustrated embodiment, a logic high CKE signal activates the CK signal that is provided to the memory array module 150, and the CK signal is used to reference the address and command signals. The CS# signal, when a logic low, enables the command decode circuitry 207. The WE# signal, when driven to a logically low level, indicates a WRITE command, and, when asserted a logic high, indicates a READ command. The RAS# and CAS# signals, when driven to a logically low level, cause an address register 210 to respectively receive and latch row and column addresses from input lines 212. In the illustrated embodiment, the input lines 212 comprises lines A0–A11 and BA0–BA1, where the A0–A11 lines carry addresses that may be interpreted as row addresses or column addresses, depending on the states of the RAS# and CAS# signals. In the illustrated embodiment, the A11 line is a redundant line, and, as described below, may be utilized to define the burst length that is used to access the memory array module 150. The BA0–BA1 input lines provide bank addresses to bank control logic 214 that, based on the provided addresses, selects one or more of the memory banks 215. Data is output on a line 220 in response to a READ operation, and is input from the line 220 in response to a WRITE operation.

The memory array module 150 includes a row-address multiplexer 225 that, based on the received row addresses, selects the desired row in the memory array 215. The row-address multiplexer 225 and the bank control logic 214 are coupled to a latch and decoder 227 that stores and decodes the received row and bank addresses.

The memory array module 150 includes a column address latch 230 that stores the addresses received on lines A0–A8 and provides the latched addresses to the column decoder 235. In accordance with one embodiment of the present invention, the column address latch 230 also receives the data on the A11 line, and, depending on the type of operation (e.g., READ or WRITE) provides a column control signal on line 237 to either an input register 240 or a multiplexer 242. As described below, the column control signal on the line 237 is utilized to adjust the burst length associated with a given memory access.

The memory array module 150 includes an I/O gating logic 245 that accesses the memory array 215. For a READ operation, the I/O gating logic 245 receives the data from the memory array 215, where the data is then latched by a read latch 247. The data from the read latch 247 is provided to the multiplexer 242, which outputs data based on the column control signal provided on the line 237. The data from the multiplexer 242 is driven onto the line 220 by the driver 250. The I/O gating logic 245 and the memory array 215 may interface through one or more sense amplifiers 255, which are well known in the art, and thus are not discussed in detail herein.

For a WRITE operation, the data from the line 220 is received by a receiver 260, which then provides the data to be written to the input registers 240. Based on the column control signal on the line 237, the input registers 240 provide the received data to a write FIFO and driver block 262, which streams out the data in first-in, first-out order to the I/O gating logic 245. The I/O gating logic 245 thereafter stores the data in the memory array 215.

In the illustrated embodiment of FIG. 2, the redundant A11 address line is used to provide burst length information. As noted, the burst length determines the number of column locations that can be accessed for a given access (READ or WRITE) operation. One manner of adjusting the burst length in association with a READ operation is described next. A READ memory operation begins with the memory controller 160 (see FIG. 1) issuing an ACTIVE command to open (or activate) a row in a particular bank of the memory array 215. The addresses asserted on the BA0 and BA1 lines select the desired bank, and the address provided on inputs A0–A12 (with RAS# asserted) selects a desired row. Thereafter, a READ command is used to initiate a burst read access to the active row. The addresses presented on the A0–A8 lines (with CAS# asserted) represent a starting column location from which the memory array 215 outputs the requested data. This data is then latched by the read latch 247. In one embodiment, based on the starting column location, the memory array 215 may prefetch data and provide it to the read latch 247.

In accordance with one embodiment of the present invention, in association with the READ command, a burst length information (e.g., 4 beats, 8 beats, etc.) is provided on the redundant line A11 to the column address latch 230, which, based on the value on the A11 line, provides the control signal on the line 237 to the multiplexer 242. The multiplexer 242, based on the burst length represented by the control signal on the line 237, outputs the desired beats of data from the read latch 247 to the driver 250. The driver 250 thereafter drives the received data onto the line 220. Thus, in accordance with one embodiment of the present invention, the burst length information associated with a given memory access is provided substantially contemporaneously with a command (e.g., READ or WRITE) to access the memory. The act of adjusting the burst length substantially contemporaneously with the memory access command may be better understood with reference to a timing diagram illustrated in FIG. 3.

Figure 3:
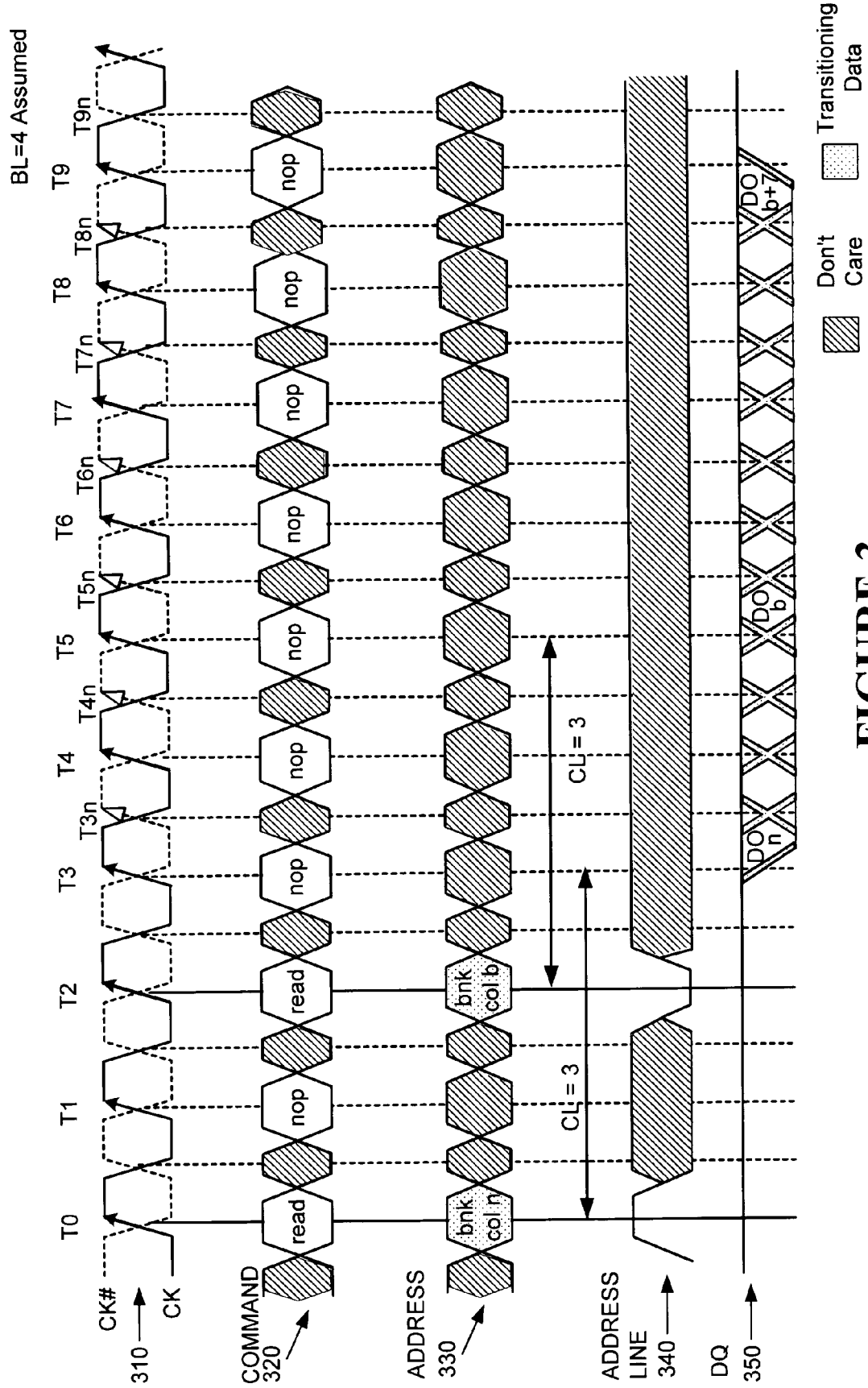
FIG. 3 illustrates an exemplary timing diagram of accessing the memory array module of FIG. 2 with various burst lengths, in accordance with one embodiment of the present invention.

FIG. 3 illustrates an exemplary timing diagram of two memory READ accesses. The first READ access is performed with a burst length of four (4), and the second READ access is performed with a burst length of eight (8). As explained earlier, a smaller beat burst may be desired for requests from a peripheral client 140 (see FIG. 1), and a larger beat burst may be desired for requests from a main client 135 (see FIG. 1). Because the peripheral client 140 typically requires smaller amounts of data relative to the main client 135, for illustrative purposes, it is herein assumed that the memory controller 160 employs a burst length of four (4) beats to access data for the peripheral client 140 and employs a burst length of eight (8) to access data for the main client 135. It should be appreciated that these burst lengths are exemplary in nature, and that other burst lengths may be employed, depending on the implementation.

The timing diagram of FIG. 3 assumes that an ACTIVE command has been issued and the desired row has been activated. In FIG. 3, line 310 of the timing diagram illustrates clocks CK and CK#, line 320 illustrates the command that are issued by the memory controller 160, line 330 illustrates the bank and column addresses that are asserted in association with the command on line 320, line 340 illustrates the burst length desired, and line 350 illustrates the data that is output in response to the command that is asserted on the line 320 with the burst length that is specified on the line 340.

As shown in FIG. 3, the memory controller 160 asserts two READ operations, one at time T0 and the other at time T2. The first READ operation is issued with a burst length of four (4), and the second READ operation with a burst length of eight (8). In the illustrated embodiment, a logic high on the line 340 indicates that a 4-beat burst is desired, and a logic low indicates that a 8-beat burst is desired.

At time T0, the memory controller 160 issues a READ command (shown on the line 320), and asserts a starting address of column n of a particular BANK (see line 330). Substantially contemporaneously with issuing the READ command, the memory controller 160 asserts a logic high on the line 340 at time T0 to indicate that a 4-beat burst is desired. Assuming that the cache latency is 3 clock cycles, the memory array 215 outputs a 4-beat burst data, starting at the rising edge of cycle T3 and ending at the rising edge of cycle T5 (see line 350). At time T2, the memory controller 160 issues the second READ command (shown on the line 320), and asserts a starting address of column b of a particular BAND (see line 330). Because a 8-beat burst is desired for this transaction, the memory controller 160 asserts a logic low on the line 340 at time T2 to indicate that a 8-beat burst is desired. As shown on line 350, the data from the starting address of column b is outputted in an 8-beat burst at the rising edge of clock T5.

While FIG. 3 illustrates exemplary READ operations with varying burst lengths, those skilled in the art having the benefit of this disclosure will appreciate that the burst length may similarly be adjusted for WRITE operations.

Figure 4A:
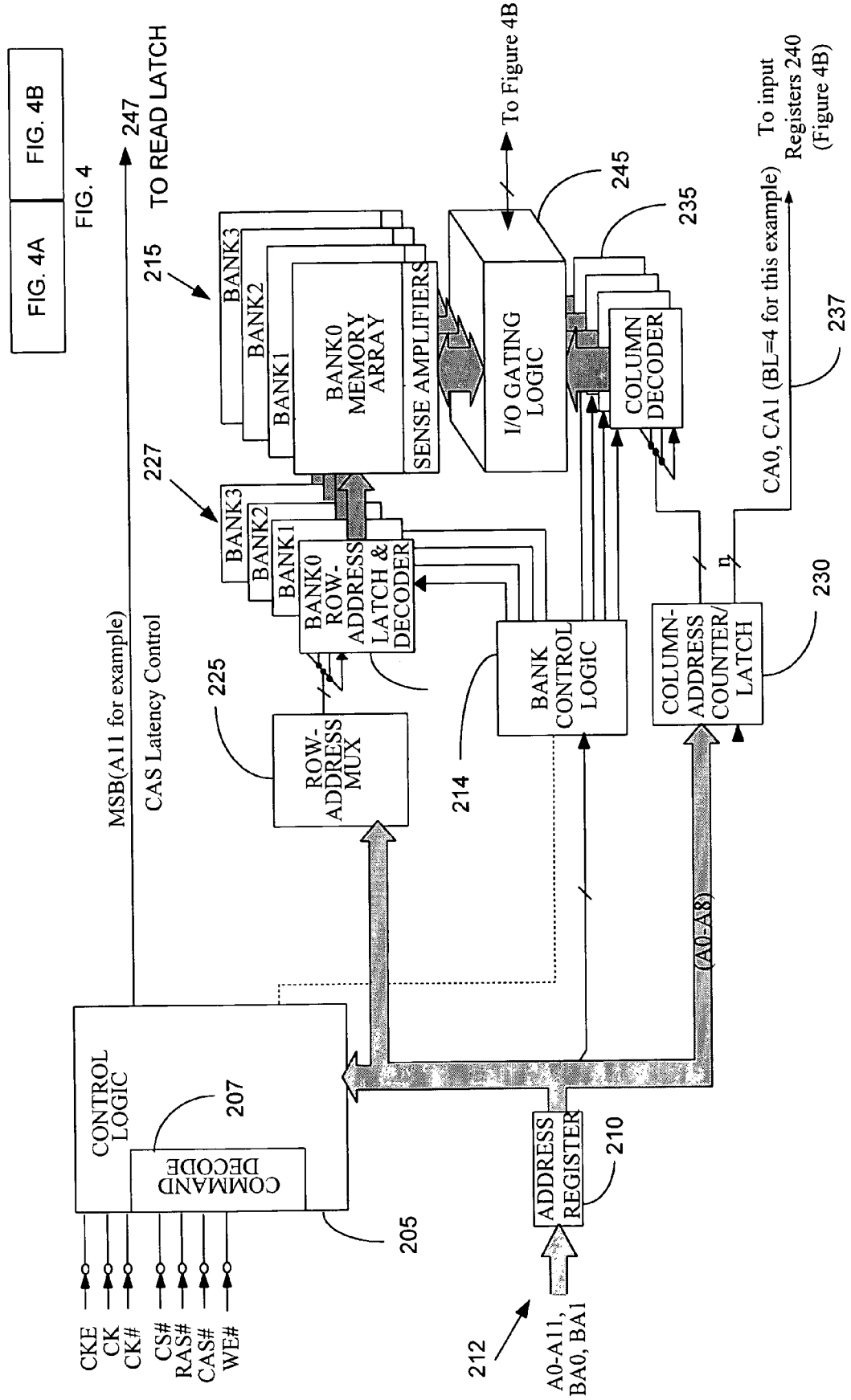
Figure 4B:
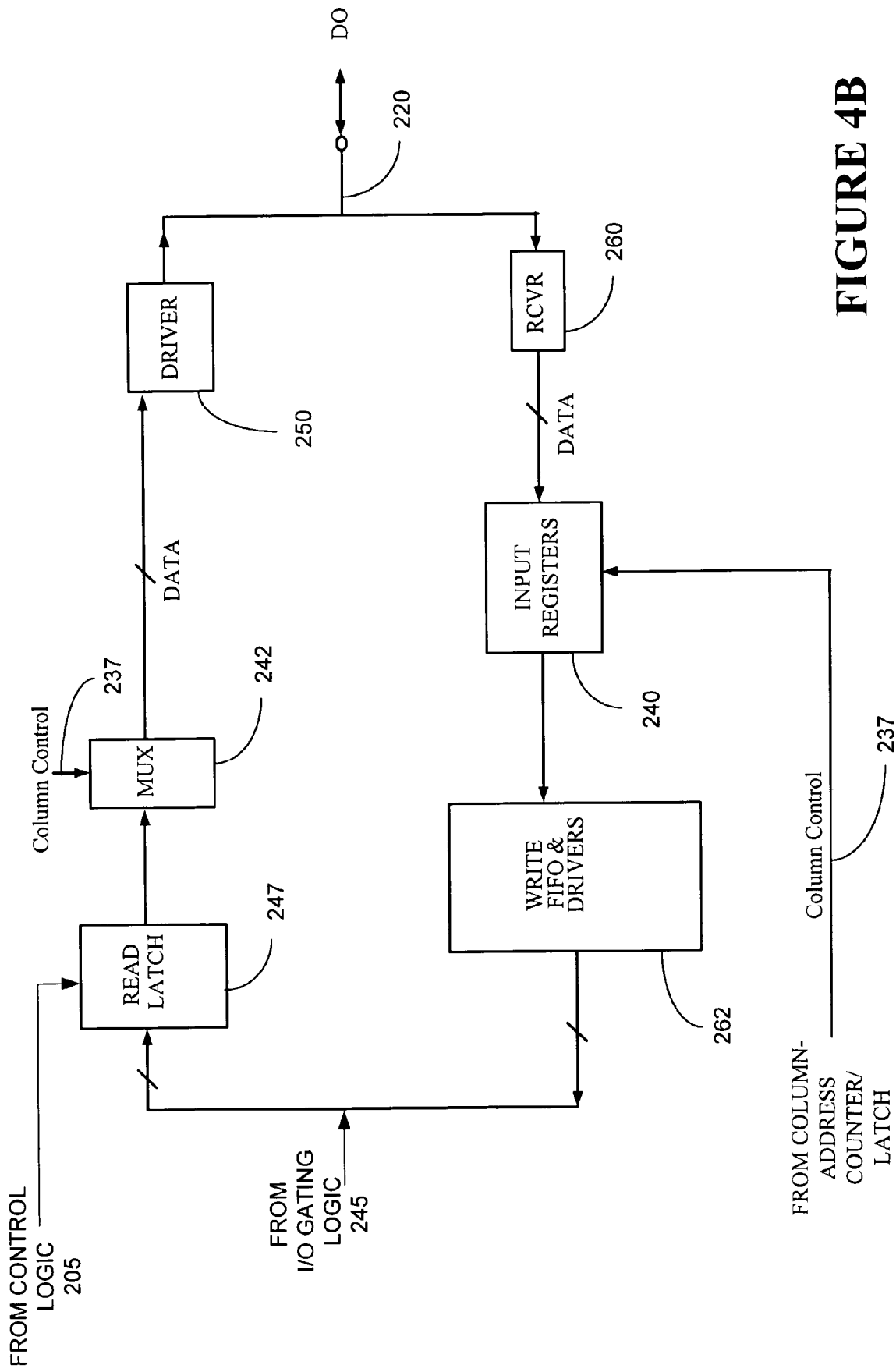

Referring now to FIG. 4, a block diagram of one embodiment of the memory array module 150 of FIG. 1 is illustrated for adjusting the CAS latency substantially contemporaneously with a memory access command. The memory array module 150 of FIG. 4 includes many of the same functional components as the memory array module 150 of FIG. 2, and, as such, these components are referenced by like numerals. In the illustrated memory array module 150 of FIG. 4, the desired CAS latency is indicated by the memory controller 160 (see FIG. 1) over the A11 line to the address register 210 of the memory array module 150. Thus, in the illustrated embodiment, as the memory controller 160 issues a memory access command (e.g., READ or WRITE), it also substantially contemporaneously indicates to the memory array module 150 over the redundant address line A11 the CAS latency that is desired for that memory access. In the memory array module 150, the address register 210 provides the desired CAS latency to the control logic 205, which, based on the desired CAS latency, generates and provides a CAS latency control signal to the read latch 247. The read latch 247 thereafter is used to provide the desired CAS latency. The act of adjusting the CAS latency substantially contemporaneously with the memory access command may be better understood with reference to a timing diagram illustrated in FIG. 5.

Figure 5:
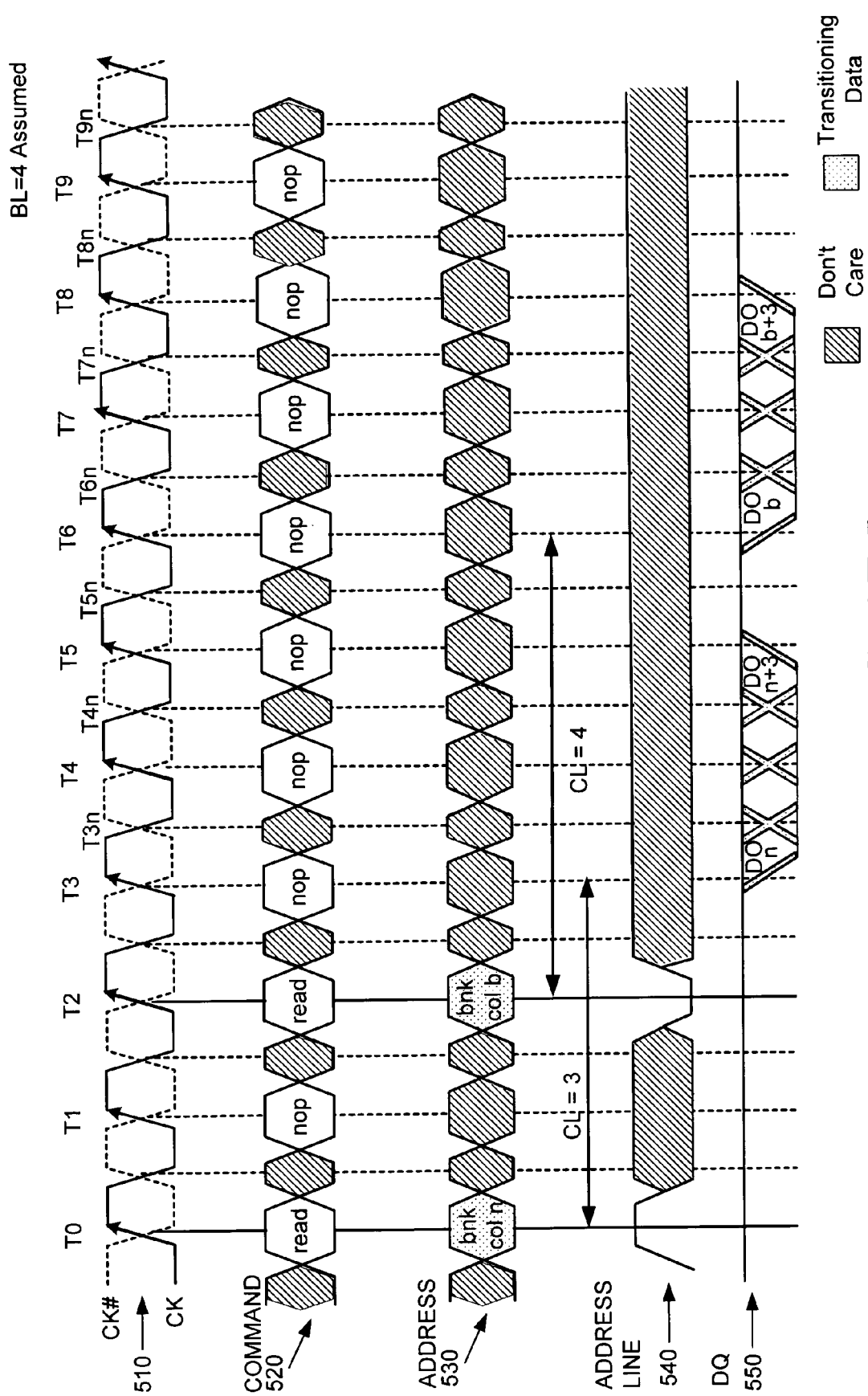
FIG. 5 illustrates an exemplary timing diagram of accessing the memory array module of FIG. 4 with various CAS latency levels, in accordance with one embodiment of the present invention.

FIG. 5 illustrates an exemplary timing diagram of two memory READ accesses. The first READ access is performed with a CAS latency of three (3), and the second READ access is performed with a CAS latency of four (4). It should be appreciated that these CAS latency levels are exemplary in nature, and that other latency levels may be employed, depending on the implementation. A burst length of four (4) beats is assumed for the purposes of this illustration.

The timing diagram of FIG. 5 assumes that an ACTIVE command has been issued and the desired row has been activated. In FIG. 5, line 510 of the timing diagram illustrates clocks CK and CK#, line 520 illustrates the commands that are issued by the memory controller 160, line 530 illustrates the bank and column addresses that are asserted in association with the command on line 520, line 540 illustrates the CAS latency that is desired, and line 550 illustrates the data that is output in response to the command that is asserted on the line 520 with the CAS latency specified on the line 540.

As shown in FIG. 5, the memory controller 160 asserts two READ operations, one at time T0 and the other at time T2. The first READ operation is issued with a CAS latency of three (3), and the second READ operation with a CAS latency of four (4). In the illustrated embodiment, a logic high on the line 540 indicates that a CAS latency of three (3) is desired, and a logic low indicates that a CAS latency of four (4) is desired.

At time T0, the memory controller 160 issues a READ command (shown on the line 520), and asserts a starting address of column n of a particular BANK (see line 530). Substantially contemporaneously with issuing the READ command, the memory controller 160 asserts a logic high on the line 540 at time T0 to indicate that a CAS latency of three (3) is desired. Because a burst length of four (4) is assumed, the memory array 215 outputs a 4-beat burst data three (3) clock cycles after the rising edge of cycle T0 (i.e., the data is provided starting at the rising edge of cycle T3 and ending at the rising edge of cycle T5 (see line 550)). Thus, as can be seen, the CAS latency for the first READ operation is three (3) clock cycles.

At time T2, the memory controller 160 issues the second READ command (shown on the line 520), and asserts a starting address of column b of a particular BAND (see line 530). Because a CAS latency of four (4) is desired for this transaction, the memory controller 160 asserts a logic low on the line 540 at time T2 to indicate that a CAS latency of four (4) is desired. Because a burst length of four (4) is assumed, the memory array 215 outputs a 4-beat burst data four (4) clock cycles after the rising edge of cycle T2 (i.e., the data is provided starting at the rising edge of cycle T6 and ending at the rising edge of cycle T8 (see line 550)). Thus, as can be seen, the CAS latency for the second READ operation is four (4) clock cycles.

Figure 6A:
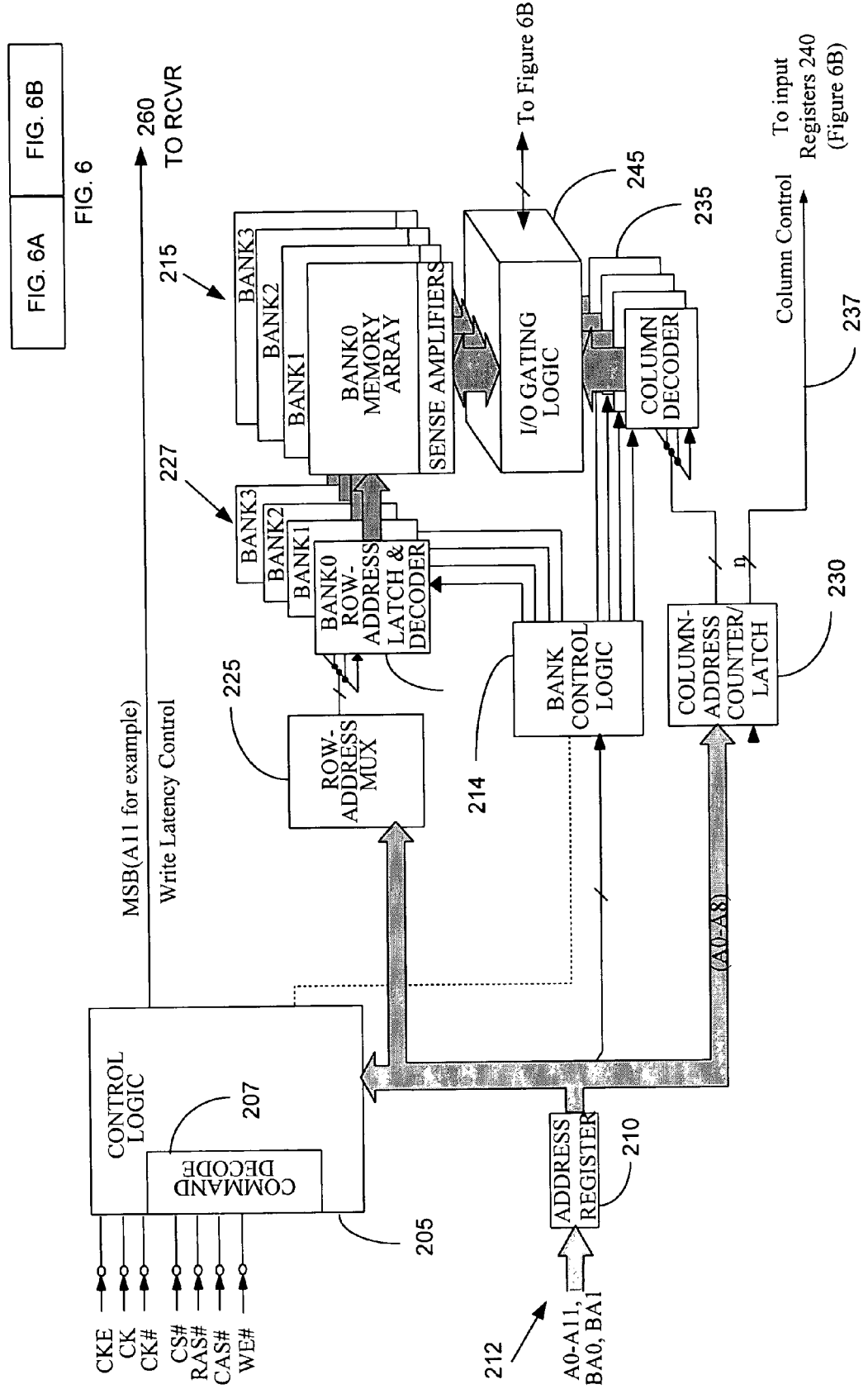
Figure 6B:
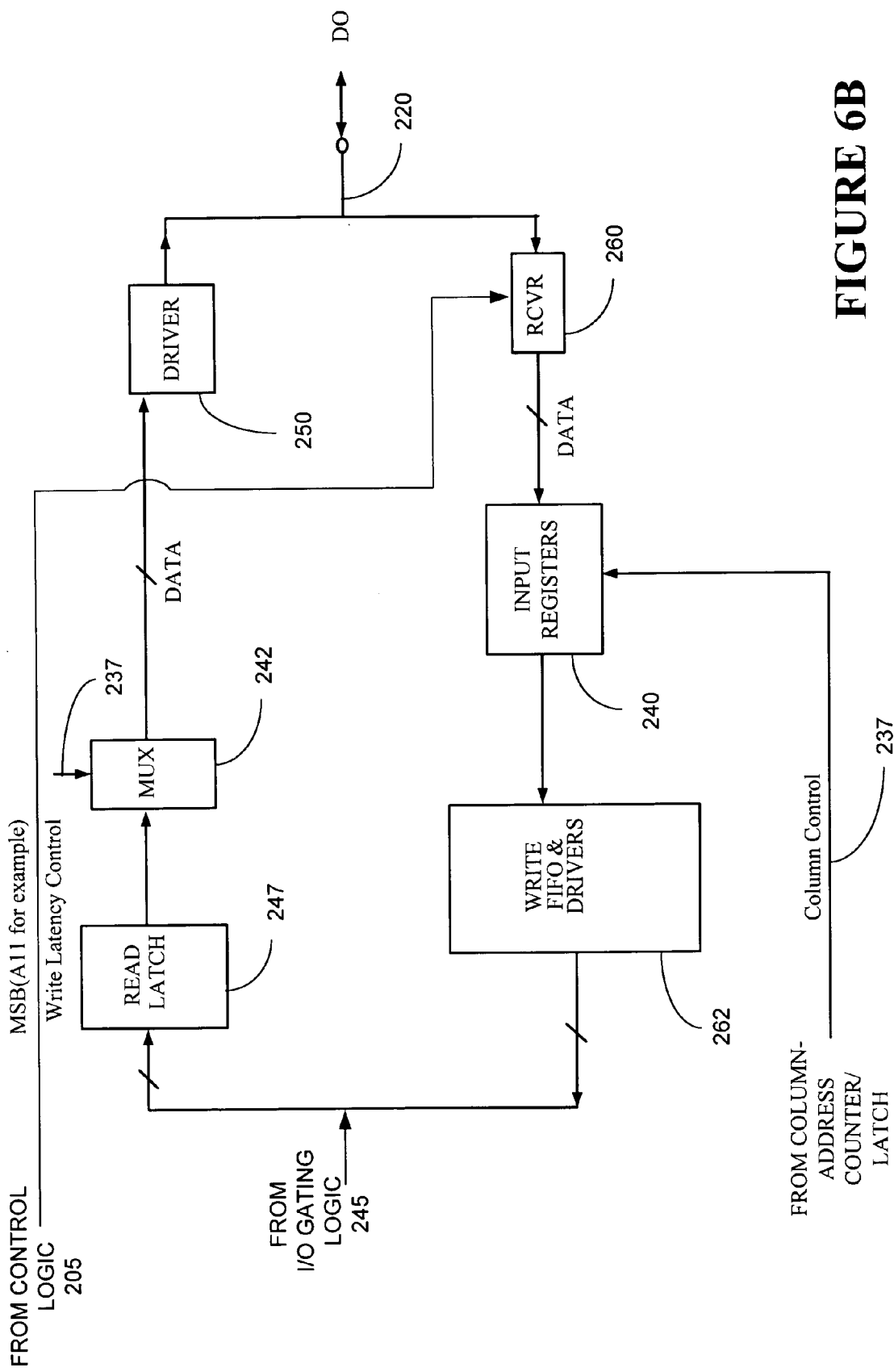

Referring now to FIG. 6, a block diagram of one embodiment of the memory array module 150 of FIG. 1 is illustrated for adjusting the write latency substantially contemporaneously with a memory access command. The write latency is the delay, in clock cycles, between the registration of a WRITE command and the availability of the first bit of input data.

The memory array module 150 of FIG. 6 includes many of the same functional components as the memory array module 150 of FIG. 2, and, as such, these components are referenced by like numerals. In the illustrated memory array module 150 of FIG. 6, the desired write latency is indicated by the memory controller 160 (see FIG. 1) over the A11 line to the address register 210 of the memory array module 150. Thus, in the illustrated embodiment, as the memory controller 160 issues a memory access command (e.g., READ or WRITE), it also substantially contemporaneously indicates to the memory array module 150 over the redundant address line A11 the write latency that is desired for that memory access. In the memory array module 150, the address register 210 provides the desired write latency to the control logic 205, which, based on the desired write latency, generates and provides a write latency control signal to the receiver 260. The receiver 260 thereafter is used to provide the desired write latency. The act of adjusting the write latency substantially contemporaneously with the memory access command may be better understood with reference to a timing diagram illustrated in FIG. 7.

Figure 7:
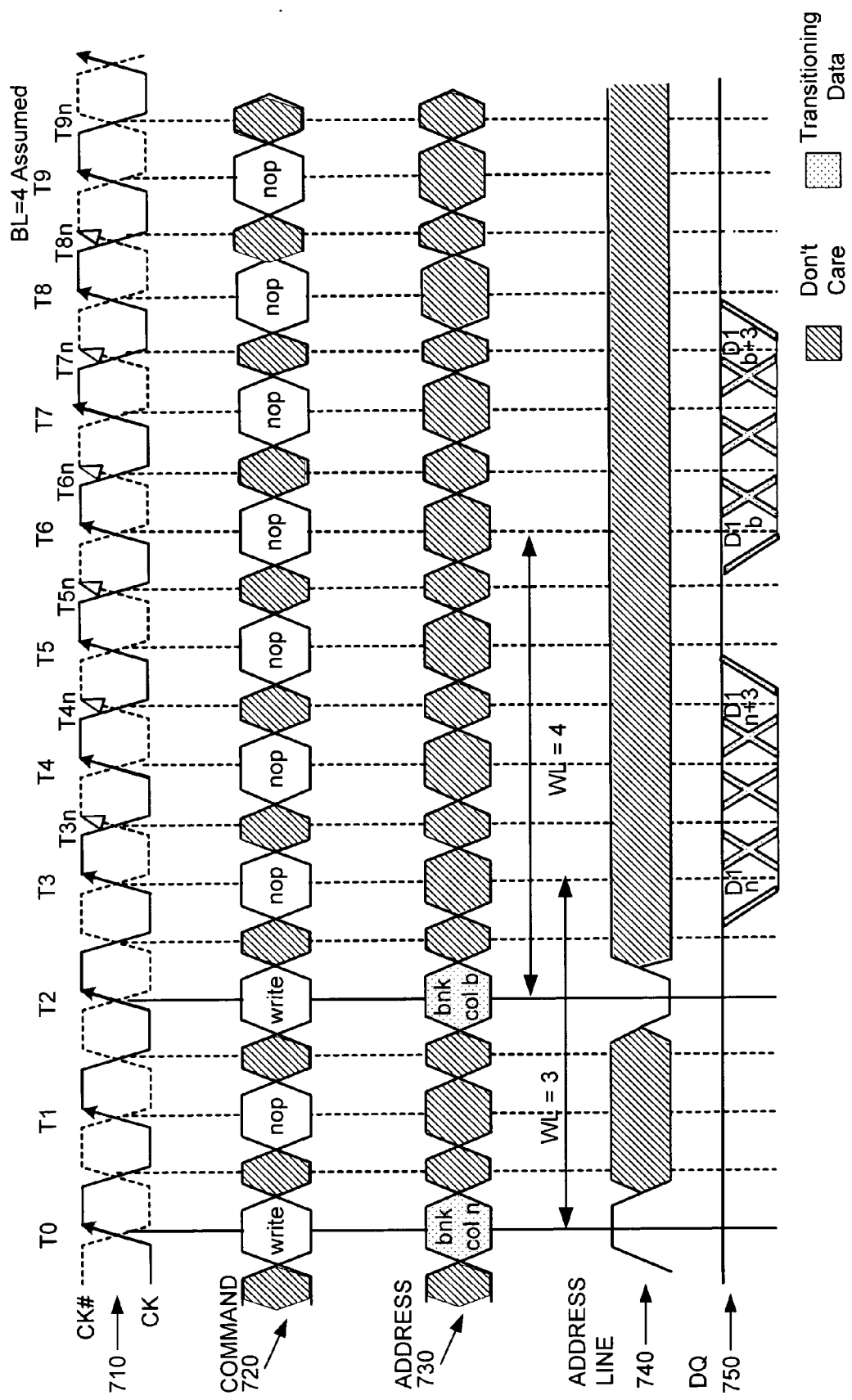
FIG. 7 illustrates an exemplary timing diagram of accessing the memory array module of FIG. 6 with various write latency levels, in accordance with one embodiment of the present invention.

FIG. 7 illustrates an exemplary timing diagram of two memory WRITE accesses. The first WRITE access is performed with a write latency of three (3), and the second WRITE access is performed with a write latency of four (4). It should be appreciated that these write latency levels are exemplary in nature, and that other latency levels may be employed, depending on the implementation. A burst length of four (4) beats is assumed for the purposes of this illustration.

The timing diagram of FIG. 7 assumes that an ACTIVE command has been issued and the desired row has been activated. In FIG. 7, line 710 of the timing diagram illustrates clocks CK and CK#, line 720 illustrates the commands that are issued by the memory controller 160, line 730 illustrates the bank and column addresses that are asserted in association with the command on line 720, line 740 illustrates the write latency that is desired, and line 750 illustrates the data that is output in response to the command that is asserted on the line 720 with the write latency specified on the line 740.

As shown in FIG. 7, the memory controller 160 asserts two WRITE operations, one at time T0 and the other at time T2. The first WRITE operation is issued with a write latency of three (3), and the second WRITE operation with a write latency of four (4). In the illustrated embodiment, a logic high on the line 540 indicates that a write latency of three (3) is desired, and a logic low indicates that a write latency of four (4) is desired.

At time T0, the memory controller 160 issues a WRITE command (shown on the line 520), and asserts a starting address of column n of a particular BANK (see line 530). Substantially contemporaneously with issuing the WRITE command, the memory controller 160 asserts a logic high on the line 540 at time T0 to indicate that a write latency of three (3) is desired. Because a burst length of four (4) is assumed, a 4-beat burst data is available on the line 220 (see FIG. 7) three (3) clock cycles after the rising edge of cycle T0 (i.e., the data is provided starting at the rising edge of cycle T3 and ending at the rising edge of cycle T5 (see line 550)). Thus, as can be seen, the write latency for the first WRITE operation is three (3) clock cycles.

At time T2, the memory controller 160 issues the second WRITE command (shown on the line 520), and asserts a starting address of column b of a particular BAND (see line 530). Because a write latency of four (4) is desired for this transaction, the memory controller 160 asserts a logic low on the line 540 at time T2 to indicate that a write latency of four (4) is desired. Because a burst length of four (4) is assumed, a 4-beat burst data is available on the line 220 (see FIG. 7) four (4) clock cycles after the rising edge of cycle T2 (i.e., the data is provided starting at the rising edge of cycle T6 and ending at the rising edge of cycle T8 (see line 550)). Thus, as can be seen, the write latency for the second WRITE operation is four (4) clock cycles.

While FIGS. 2, 4, and 6 provide illustrative examples of respectively adjusting the burst length, CAS latency, and the write latency that is associated with a given memory access, it should be appreciated that in alternative embodiments the memory array module 150 may be modified to support adjusting two or more of these features. That is, in one embodiment, the burst length and the CAS latency may be adjusted substantially contemporaneously with a memory access. In another embodiment, the burst length and the write latency may be adjusted. In yet another embodiment, the CAS latency and the write latency may be adjusted. In yet another embodiment, all three features may be adjusted substantially contemporaneously with a memory access. To adjust two or more of these features, it may be useful to employ additional address lines to convey the desired burst length, CAS latency, and write latency information to the memory array module 150.

It should be appreciated that the block diagrams depicted in FIGS. 2, 4, and 6 are illustrative in nature, and that depicted memory array module 150 may include additional, fewer, or different components without deviating from the spirit and scope of the invention. For example, in one embodiment, the column control signal on the line 237 in FIG. 2 may be provided to the I/O gating logic 245 (as opposed to the multiplexer 242 and input registers 240) to adjust the burst length. If the signal on the line 237 is provided to the I/O gating logic 245, the I/O gating logic 245 accesses (reads or writes) the memory array 215 according to the value specified on the line 237. For example, if a burst length of 8 is specified, then the I/O gating logic 245 accesses 8 beats of data from the memory array 215. Similarly, with respect to FIGS. 4 and 6, the latency control signal provided by the control logic 205 may be provided to the I/O gating logic 245 (as opposed to the read latch 247 (see FIG. 4) or to the receiver 260 (see FIG. 6)). Additionally, instead of using the redundant address lines (e.g., A11) to specify the burst length, CAS latency, or write latency, in an alternative embodiment, any other suitable manner may be utilized to convey the desired information, including defining additional lines. Similarly, other modifications may be made to the memory array module 150 without deviating from the spirit and scope of the invention.

In accordance with one or more embodiments of the present invention, an efficient manner of accessing the memory array module 150 is provided. As described, in one embodiment, depending on the relative size of the data to be transferred to or received from the memory array module 150, the burst length, CAS latency, and/or write latency may be adjusted to optimize the data transfer. Moreover, because the burst length information, CAS latency information, and/or write latency information can be provided substantially contemporaneously with the memory access command, it is possible to conserve power.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   receiving a command from a controller to access a memory in response to a memory request received from a source;
   determining the desired burst length information or latency information in response to receiving the memory request from the source; and
   providing data to or from the memory based on at least one of the burst length information and the latency information in response to receiving the burst length information or latency information over at least one of a redundant row address line and a redundant column address line.

2. The method of claim 1, wherein receiving a command comprises receiving at least one of a READ operation and WRITE operation to access the contents of the memory.

3. The method of claim 2, wherein determining the latency information comprises receiving at least one of column address strobe latency information and write latency information.

4. The method of claim 1, wherein determining the desired burst length information comprises determining the desired burst length information based on an amount of data to be retrieved from the memory.

5. The method of claim 1, wherein determining the burst length information comprises determining the burst length information based on the source that provides the memory request.

6. An apparatus, comprising:
   a controller adapted to:
      provide a command to access a memory array in response to a memory request received from a source;
      determine at least one of burst length information and latency information;
      provide the at least one of burst length information and latency information over at least one of a redundant row address line and a redundant column address line; and
      receive data from the memory array based on at least one of the burst length information and the latency information.

7. The apparatus of claim 6, wherein the controller is adapted to issue a READ operation access the contents of the memory.

8. The apparatus of claim 6, wherein the controller is adapted to provide at least one of the burst length information and the latency information contemporaneously with the command to access the memory.

9. The apparatus of claim 6, wherein the controller is adapted to provide a burst length of a first pre-selected value in response to receiving a request from a peripheral client and a burst length of a second pre-selected value in response to receiving a request from a main client, wherein the first pre-selected value is less than the second pre-selected value.

10. The apparatus of claim 6, wherein the controller is adapted to issue a WRITE command and adapted to provide write latency information contemporaneously with the WRITE command.

11. A system, comprising:
   a memory array, and
   a controller communicatively coupled to the memory array, the controller adapted to:
      provide a command to access the memory array in response to a memory request received from a source; and
      determine at least one of burst length information and latency information in response to receiving the memory request;
      provide the at least one of burst length information and latency information over least one of a redundant row address line and a redundant column address line; and
   wherein the memory array is adapted to provide or receive data based on at least one of the burst length information and the latency information.

12. The system of claim 11, wherein the controller is adapted to issue at least one of a READ operation and WRITE operation access the contents of the memory.

13. The system of claim 11, wherein the controller is adapted to provide at least one of the burst length information and the latency information contemporaneously with the command to access the memory.

14. The system of claim 11, wherein the controller is adapted to provide a burst length of a first pre-selected value in response to receiving a request from a peripheral client and a burst length of a second pre-selected value in response to receiving a request from a main client, wherein the first pre-selected value is less than the second pre-selected value.

15. An apparatus, comprising:
   means for providing a command from a controller to access a memory in response to a memory request received from a source;
   means for determining burst length information or latency information in response to receiving the memory request;
   means for providing the at least one of burst length information and latency information over a redundant address line, wherein the redundant address line comprises at least one of a redundant row address line and a redundant column address line; and
   means for providing data to or from the memory based on at least one of the burst length information and the latency information.

16. An apparatus, comprising:
   a memory adapted to:
      receive a request to access contents of the memory;
      receive, from the memory controller, at least one of burst length information and latency information over at least one of a redundant row address line and a redundant column address line; and
      provide data from the memory based on at least one of the burst length information and the latency information.

17. The apparatus of claim 16, wherein memory is adapted to receive at least one of the burst length information and the latency information contemporaneously with the command to access the memory.

18. The apparatus of claim 16, wherein the memory is adapted to receive a burst length of a first pre-selected value in response to the controller receiving a request from a peripheral client and a burst length of a second pre-selected value in response to the controller receiving a request from a main client, wherein the first pre-selected value is less than the second pre-selected value.

19. The apparatus of claim 16, wherein the memory is adapted to receive a WRITE command and adapted to receive write latency information contemporaneously with the WRITE command.

* * * * *